United States Patent [19]

Todoroki

[11] Patent Number: 5,502,736
[45] Date of Patent: Mar. 26, 1996

[54] VITERBI DECODER FOR DECODING ERROR-CORRECTING ENCODED INFORMATION SYMBOL STRING

[75] Inventor: Toshiya Todoroki, Tokyo, Japan

[73] Assignee: NEC Corporation, Japan

[21] Appl. No.: 65,145

[22] Filed: May 20, 1993

[30]     Foreign Application Priority Data

May 26, 1992  [JP]  Japan .................................. 4-133758

[51] Int. Cl.[6] ............................ G06F 11/10; H03M 13/12
[52] U.S. Cl. ............................................................ 371/43
[58] Field of Search ................................. 371/43, 44, 45, 371/38.1, 39.1, 40.2, 40.3

[56]                References Cited

U.S. PATENT DOCUMENTS 5,150,369   9/1992   Costa et al. ............................. 371/43

OTHER PUBLICATIONS

Aikawa, Satoru, et al., *Journal of the Electronic Information Communication Society*, "Design Schemes for a High-Speed/Multilevel Trellis Coded Modulation Viterbi Decoder", vol. J73-A, No. 2, (Feb., 1990), pp. 331-340.
Aikawa, Satoru, et al., *IEEE Globecom '90*, "150 KGate General-Purpose High-Coding-Gain TCM VLSIs for High-Speed Multi-Level QAM Systems", vol. 3 (1990), pp. 1963-1967.
Ungerboeck, Gottfried, *IEEE Transactions on Information Theory*, "Channel Coding with Multilevel/Phase Signals", vol. IT-28 (Jan., 1982), pp. 55-67.
Aikawa, Satoru, et al., *Journal of the Electronic Information Communication Society*, "Design Schemes for a High-Speed/Multilevel Trellis Coded Modulation Viterbi Decoder", vol. J73-A, No. 2, (Feb., 1990), pp. 331-340.
Aikawa, Satoru, et al., *IEEE Globecom '90*, "150 KGate General-Purpose High-Coding-Gain TCM VLSIs for High-Speed Multi-Level QAM Systems", vol. 3 (1990), pp. 1963-1967.
Ungerboeck, Gottfried, *IEEE Transactions on Information Theory*, "Channel Coding with Multilevel/Phase Signals", vol. IT-28 (Jan., 1982), pp. 55-67.

*Primary Examiner*—Roy N. Envall, Jr.
*Assistant Examiner*—Emmanuel L. Moise
*Attorney, Agent, or Firm*—Ostrolenk, Faber, Gerb & Soffen

[57]                ABSTRACT

A Viterbi decoder includes a first inverse mapping circuit, first to fourth branch metric generators, first to eighth accumulator switch circuits (ACS circuits) with one ACS circuit corresponding to one of the eight states of the feedback-type convolutional encoder, a path memory, and a re-encoder for the purpose of decoding an influential bit and a redundant bit of 4-bit error-correcting encoded information symbol string from I-channel data and Q-channel data. A Viterbi decoder also includes first and second shift registers having a number of levels determined according to the delay in the re-encoder and the delay in the path memory and a second inverse mapping circuit for the purpose of decoding noncoding bits of 4-bit error-correcting encoded information symbol string using the I-channel data and the Q-channel data.

18 Claims, 3 Drawing Sheets

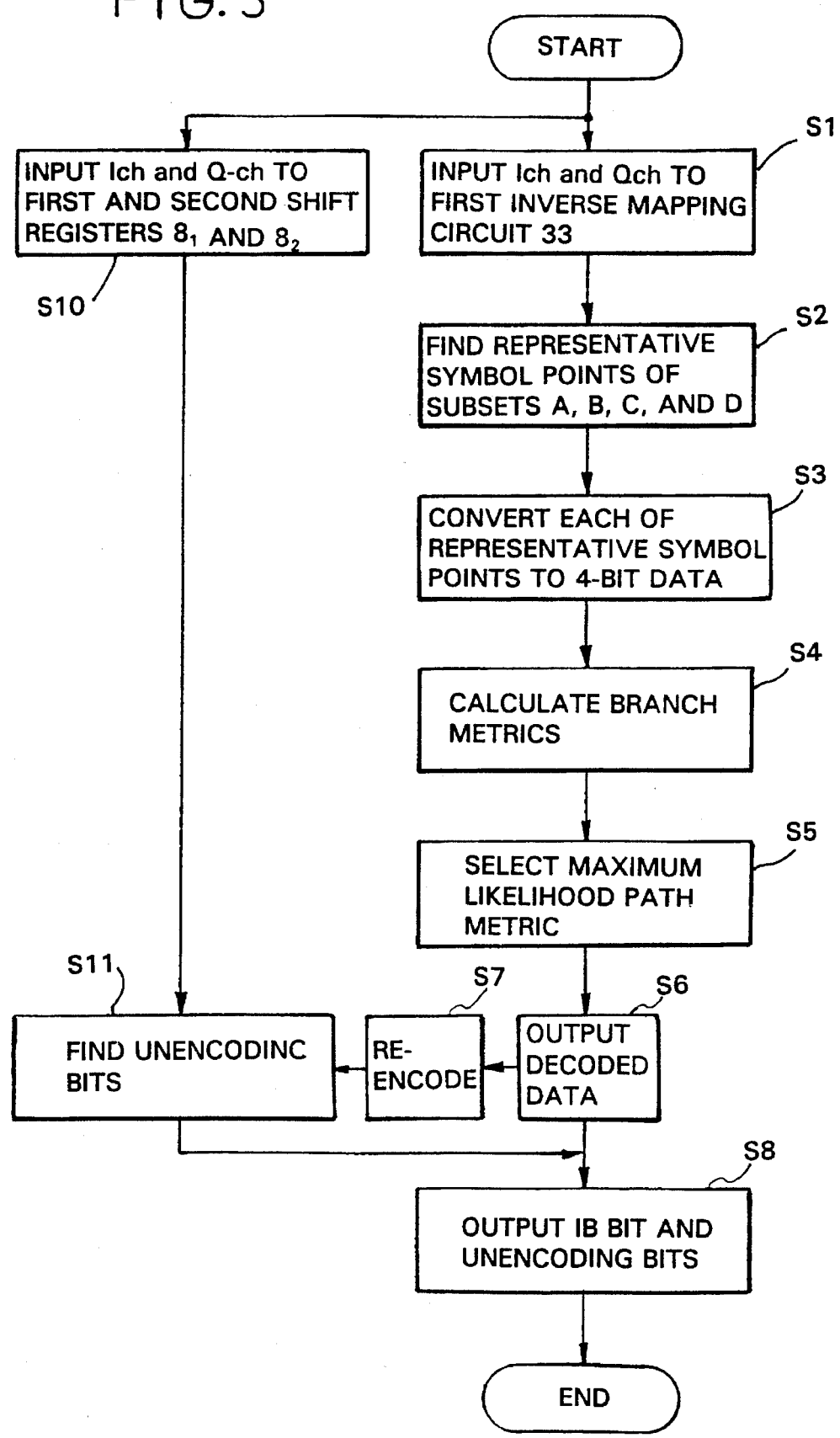

VITERBI DECODER FOR DECODING ERROR-CORRECTING ENCODED INFORMATION SYMBOL STRING

BACKGROUND OF THE INVENTION

The present invention relates to a Viterbi decoder that is provided in a receiver and decodes an error-correcting encoded information symbol string in a communication system in which an information symbol string is transmitted after being error-correcting encoded by means of a feedback-type convolutional encoder and being quadrature amplitude-modulated.

In the digital communication field, error-correcting encoding methods and modulation methods have conventionally been considered as separate and independent subjects. Recently however, an encoded modulation technique that combines error-correcting techniques and modulation/demodulation techniques has been proposed (G. Ungerboeck, *Channel Coding with Multilevel/Phase Signals*, IEEE Transactions on Information Theory, vol. IT-28, January 1983). This proposed encoded modulation technique is a technique of quadrature amplitude-modulating an error-correcting encoded information symbol string which is generated by error-correcting encoding an information symbol string by means of a convolutional encoder, but in the process of quadrature amplitude modulation, a measure has been taken for the arrangement of transmission symbol points. According to this measure, in the convolutional encoder, through the addition of 1-bit redundancy based on the states of finite state memories provided in the convolutional encoder, an N-bit information string is converted to an (N+1)-bit error-correcting encoded information symbol string. The error-correcting encoded information symbol string, when quadrature amplitude-modulated, is mapped onto one of $2^{N+1}$ transmission symbol points. The $2^{N+1}$ transmission symbol points are then arranged in a two-dimensional plane based on an I-axis and a Q-axis. The error-correcting encoded information symbol string is mapped onto one of the two-dimensionally distributed $2^{N+1}$ transmission symbol points in accordance with its value. As described in the above-mentioned reference, the $2^{N+1}$ transmission symbol points are divided into subsets each of which is constituted by two transmission symbol points. The Euclidean distance between the two transmission symbol points belonging to each subset is then made greater than the Euclidean distance between two arbitrary transmission symbol points.

Encoding an information symbol string by a feedback-type convolutional encoder is carried out in the following manner. An N-bit information symbol string is divided into noncoding bits that have no influence on the state transition of the finite state memories of the feedback-type convolutional encoder and influence bits, referred to as IB bits, that have influence on the state transition of the finite memories of the feedback-type convolutional encoder. The IB bits are inputted to the finite state memories of the feedback-type convolutional encoder. As a result, through the addition of a 1-bit redundancy based on the state of the finite state memories, the information symbol string is converted into an (N+1)-bit error-correcting encoded information symbol string. Here, the IB bits and a redundant bit that adds the 1-bit redundancy to the information symbol string are termed "encoding bits."

If the bit number of the noncoding bits is "K," the $2^{N+1}$ transmission symbol points are divided into the $2^K$ subsets each of which is constituted by two transmission symbol points. In accordance with the state transition of the finite state memories, a subset corresponding to the information symbol string is selected such that only a few sequences are effective. By selecting one transmission symbol point from the two transmission symbol points of the selected subset according to the noncoding bits, the error-correcting encoded information symbol string is mapped onto one of the $2^{N+1}$ transmission symbol points.

The decoding of the error-correcting encoded information symbol string encoded as described above is considered to be possible through the use of a Viterbi algorithm known as a maximum likelihood decoding method. The concrete composition of a Viterbi decoder is described in, for example, Aikawa et al. "The Method of Constructing a Viterbi Decoding Circuit Suitable for High-speed Multi-valued Trellis Encoded Modulation" Journal of the Electronic Information Communication Society, vol. J73-A, No. 2, February 1990. The decoding method of conventional Viterbi decoders is carried out by using a grid graph having a vertical axis representing the state of the feedback-type convolutional encoder and a horizontal axis representing the block number in order to find the encoded sequence which has the shortest hamming distance between the received information symbol string.

An example of the construction of a Viterbi decoder will be described for a case in which is transmitted an error-correcting encoded information symbol string $(x_3x_2x_1x_0)$ made up from a 3-bit information symbol string $(x_3x_2x_1)$ and a 1-bit redundant bit $x_0$. In addition, the two higher-order bits within information symbol string $(x_3x_2x_1)$ are noncoding bits $x_3x_2$ that do not influence the state transition of the finite state memories of the feedback-type convolutional encoder, and the lowest-order bit is IB bit $x_1$ that has influence on the state transition of the finite state memories of the feedback-type convolutional encoder. IB bit $x_1$ and redundant bit $x_0$ are termed encoding bits $x_1x_0$. In addition, the feedback-type convolutional encoder has three finite state memories. In other words, the feedback-type convolutional encoder has $2^3=8$ states. The number of subsets is $2^2=4$ (hereinafter referred to as subsets A, B, C, and D) and the number of transmission symbol points is $2^4$.

A Viterbi decoder 30 shown in FIG. 1 includes an inverse mapping circuit 33, first to fourth branch metric generators $34_1$–$34_4$, first to eighth accumulator switch circuits (hereinafter referred to as ACS circuits $35_1$–$35_8$), of which one circuit corresponds to one of the eight states of the feedback-type convolutional encoder, a path memory 36, a re-encoder 37, first to fourth shift registers $38_1$–$38_4$ having a number of levels set with consideration taken for the delay in the re-encoder 37 and the delay in the path memory 36, and a selector 39. The transmitted signal sent from a transmitter to a receiver is converted to two demodulated signals by means of orthogonal synchronous detection carried out by a orthogonal synchronous detector (not shown) of the receiver. Each of the two demodulated signals is converted to m-bit I-channel data Ich and m-bit Q-channel data Qch by the quantization of their amplitude values by a quantizing circuit (not shown). Here, I-channel data Ich and Q-channel data Qch are 2m-value soft decision data. I-channel data Ich and Q-channel data Qch are both inputted to the inverse mapping circuit 33 by way of two input terminals 31, 32. In the inverse mapping circuit 33, the representative symbol points of subsets A, B, C, and D are found from I-channel data Ich and Q-channel data Qch. Each of the found representative symbol points of subsets A, B, C, and D is inverse mapped onto 4-bit data corresponding to it. The noncoding bits which are the two higher-order bits of the 4-bit data inverse mapped for subset A are inputted to the first shift register $38_1$. The noncoding bits which are the two higher-order bits of the 4-bit data inverse mapped for subset B are inputted to the second shift register $38_2$. The noncoding bits which are the two higher-order bits of the 4-bit data inverse mapped for subset C are inputted to the third shift register $38_3$. The noncoding bits which are the two higher-order bits of the 4-bit data inverse mapped for subset D are inputted to the fourth shift register $38_4$.

In the first branch metric generator $34_1$, a branch metric is calculated based on the Euclidean distance between the representative symbol point of subset A found in the inverse mapping circuit 33 and a reception symbol point indicated by I-channel data Ich and Q-channel data Qch. In the second branch metric generator $34_2$, a branch metric is calculated based on the Euclidean distance between the representative symbol point of subset B found in the inverse mapping circuit 33 and the reception symbol point. In the third branch metric generator $34_3$, a branch metric is calculated based on the Euclidean distance between the representative symbol point of subset C found in the inverse mapping circuit 33 and the reception symbol point. In the fourth branch metric generator $34_4$, a branch metric is calculated based on the Euclidean distance between the representative symbol point of subset D found in the inverse mapping circuit 33 and the reception symbol point. The branch metric calculated in the first branch metric generator $34_1$ is inputted to the first ACS circuit $35_1$, the third ACS circuit $35_3$, the fifth ACS circuit $35_5$, and the seventh ACS circuit $35_7$. The branch metric calculated in the second branch metric generator $34_2$ is inputted to the second ACS circuit $35_2$, the fourth ACS circuit $35_4$, the sixth ACS circuit $35_6$, and the eighth ACS circuit $35_8$. The branch metric calculated in the third branch metric generator $34_3$ is inputted to the second ACS circuit $35_2$, the fourth ACS circuit $35_4$, the sixth ACS circuit $35_6$, and the eighth ACS circuit $35_8$. The branch metric calculated in the fourth branch metric generator $34_4$ is inputted to the first ACS circuit $35_1$, the third ACS circuit $35_3$, the fifth ACS circuit $35_5$, and the seventh ACS circuit $35_7$.

In each ACS circuit $35_1$–$35_8$, in accordance with the two inputted branch metrics and all of the state transitions prescribed by the feedback-type convolutional encoder, each of the path metric accumulated values which are held by the several states combined in transition with one state among eight states $S_0$–$S_7$ of the feedback-type convolutional encoder is added to the predetermined one of the two inputted branch metrics, and the greatest addition value is selected as the new path metric of the one state. The eight path metrics calculated in ACS circuits $35_1$–$35_8$ are inputted to the path memory 36, and decoded data is obtained in the path memory 36 by sequentially updating its contents according to the inputted path metrics. However, the decoded data obtained in the path memory 36 is only IB bit $x_1$ of encoding bits $x_1x_0$ and not encoding bits $x_1x_0$ of 4-bit error-correcting encoded information symbol string $(x_3x_2x_1x_0)$. IB bit $x_1$ obtained in the path memory 36 is inputted to the re-encoder 37, and in the re-encoder 37, the encoding bits $x_1x_0$ are calculated based on IB bit $x_1$. Here, encoding bits $x_1x_0$ calculated in the re-encoder 37 represent one of four subsets A, B, C, and D. Encoding bits $x_1x_0$ calculated in the re-encoder 37 are inputted to the selector 39. In the selector 39, the noncoding bits $x_3x_2$ of 4-bit error-correcting encoded information symbol string $(x_3x_2x_1x_0)$ are decoded by selecting from the output signals of first to fourth shift-registers $38_1$–$38_4$ the output signal that corresponds to the subset represented by encoding bits $x_1x_0$ calculated in the re-encoder 37. IB bit $x_1$ obtained with the path memory 36 and noncoding bits $x_3x_2$ selected in the selector 39 are outputted as the decoded data of information-symbol string $(x_3x_2x_1)$ to the outside from an output terminal 40 and an output terminal 41.

In the Viterbi decoder 30 shown in FIG. 1 with fixed and unchanging structure of the decoder and the bit number n of I-channel data Ich and Q-channel data Qch, in cases where an information symbol string is multi-valued in order to send a large volume of information bits, redundancy begins to be sent to the first through fourth shift registers $38_1$–$38_4$ when the bit number of I-channel data Ich and Q-Channel data Qch corresponding to bit number L of the noncoding bits and bit number K of the encoding bits satisfies the relation:

$$n < L \times 2^{K-2}$$

Consequently, the application of Large-Scale Integrated Circuit (LSI) to the Viterbi decoder 30 results in the use of superfluous gates. For example, when the bit number of the encoding bits is K=2 and the bit number of I-channel data Ich and Q-channel data Qch is n=5 (a soft decision value of 32), bit number L of the noncoding bits is greater than 2.5. In other words, when bit number L of the noncoding bits is greater than 3, the application of LSI to the first through fourth shift registers $38_1$–$38_4$ results in the use of superfluous shift gates.

SUMMARY OF THE INVENTION

An object of the present invention is to provide a Viterbi decoder capable of preventing the increase in the required number of gates when shift registers for finding noncoding bits are formed on Large-Scale Integrated Circuit.

Other objects of the present invention will become obvious from the following description.

In accordance with an aspect of the present invention, there is provided a Viterbi decoder for decoding an error-correcting encoded information symbol string from first multi-value soft decision data and second multi-value soft decision data each of which is obtained by orthogonal detection of a modulated signal which is generated by quadrature-amplitude-modulating the error-correcting encoded information symbol string by mapping the error-correcting encoded information symbol string onto one of a plurality of transmission symbol points in accordance with its value, the error-correcting encoded information symbol string being generated by error-correcting encoding an information symbol string by means of a feedback-type convolutional encoding method and comprising noncoding bits, IB bits and redundant bits, comprising: decoding means for decoding the IB bits and the redundant bits of the error-correcting encoded information symbol string from the first multi-value soft decision data and the second soft decision data; and inverse mapping means for decoding the noncoding bits of the error-correcting information symbol string by finding a representative symbol point of a subset indicated by the decoded IB bits and the decoded redundant bits among subsets, which are made up by dividing the transmission symbol points, using the first soft decision data and the second soft decision data and by inverse mapping the found representative symbol point onto data corresponding to the found representative symbol point.

BRIEF DESCRIPTION OF THE DRAWINGS

The features and advantages of the present invention will become apparent from the following description when taken in conjunction with the accompanying drawings in which:

FIG. 3 a chart illustrating the operation of the Viterbi decoder shown in FIG. 2.

DESCRIPTION OF THE PREFERRED EMBODIMENTS

Figure 2:
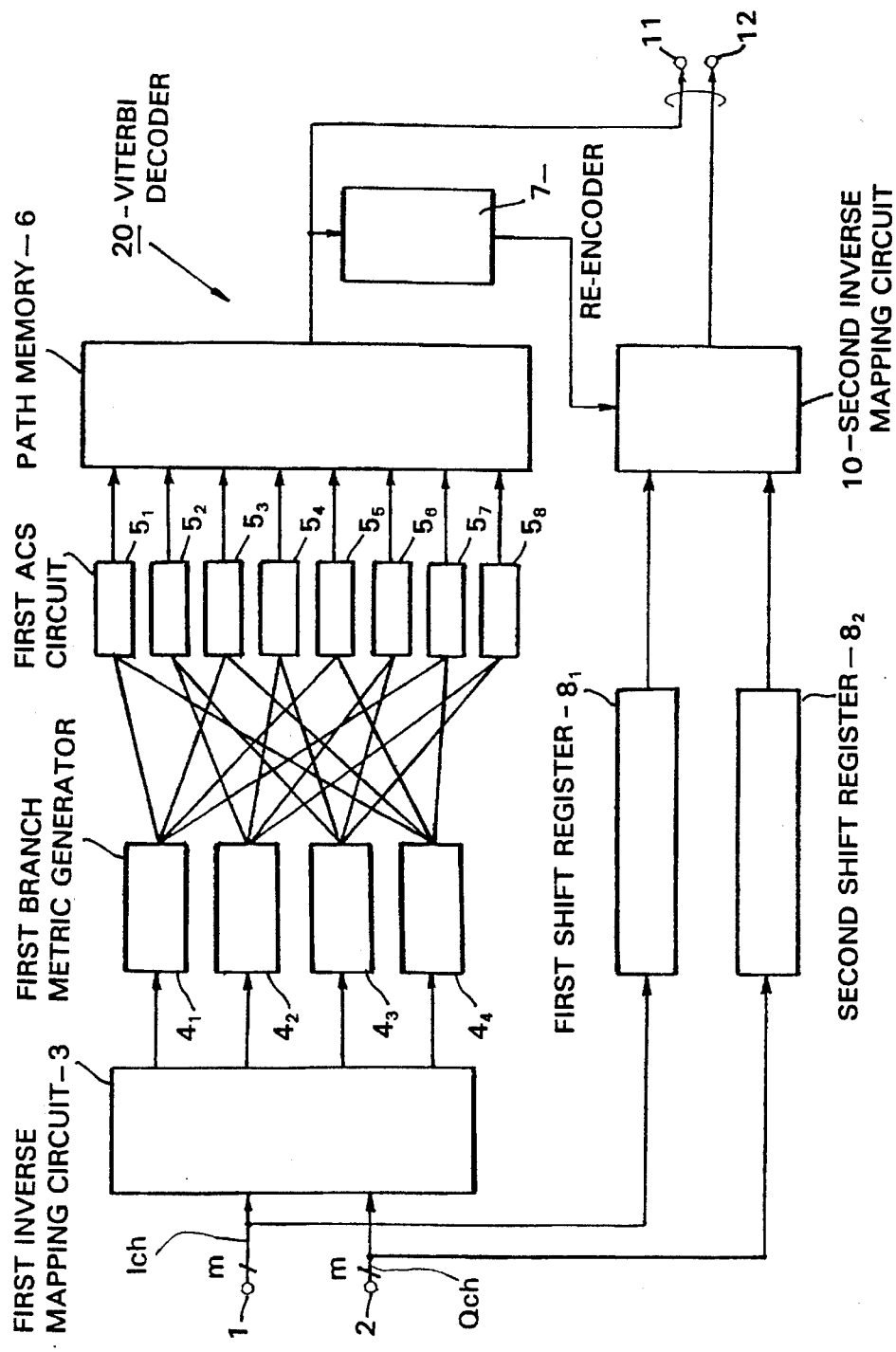
FIG. 2 is block diagram showing the composition of a Viterbi decoder according to an embodiment of the present invention.

As shown in FIG. 2, a Viterbi decoder 20 according to an embodiment of the present invention comprises a first inverse mapping circuit 3, first to fourth branch metric generators $4_1$–$4_4$, first to eighth accumulator switch circuits (hereinafter referred to as ACS circuits $5_1$–$5_8$) with one ACS circuit corresponding to one of the eight states of the feedback-type convolutional encoder, a path memory 6, a re-encoder 7, first and second shift registers $8_1$, $8_2$ having a number of levels determined according to the delay in the re-encoder 7 and the delay in the path memory 6, and a second inverse mapping circuit 10.

The first inverse mapping circuit 3 is provided for finding the representative symbol points of subsets A, B, C, and D from I-channel data Ich and Q-channel data Qch which are 2m-value soft decision data, and for inverse mapping each of the found representative symbol points of subsets A, B, C, and D onto 4-bit data corresponding to it. The first to fourth branch metric generators $4_1$–$4_4$ are provided for calculating path metrics based on the Euclidean distance from the representative symbol points of subsets A, B, C, and D found in the first inverse mapping circuit 3 to a reception symbol point indicated by I-channel data Ich and Q-channel data Qch. The first to eighth ACS circuits $5_1$–$5_8$ are provided for selecting greatest addition value as a new path metric of one state by adding each of path metric accumulated values, which are held by several states combined in transition with the one state of eight states $S_0$–$S_7$, to the predetermined one of the two branch metrics inputted from the two predetermined branch metric generators among the first to fourth branch metric generators $4_1$–$4_4$ in accordance with the two branch metrics and all of the state transitions prescribed by the feedback-type convolutional encoder. The path memory 6 is provided for sequentially updating its contents from the path metrics selected in the first to eighth ACS circuits $5_1$–$5_8$ and finally decoding IB bit $x_1$ of 4-bit error-correcting encoded information symbol string $(x_3x_2x_1x_0)$. The re-encoder 7 is provided for calculating encoding bits $x_1x_0$ of the 4-bit error-correcting encoded information symbol string $(x_3x_2x_1x_0)$ from the IB bit $x_1$ decoded in the path memory 6.

The first and second shift registers $8_1$, $8_2$ are provided for holding I-channel data Ich and Q-channel data Qch for a time just equal to the time needed for signal processing in the path memory 6 and the re-encoder 7. The second inverse mapping circuit 10 is provided for finding the representative symbol point of the subset indicated by encoding bits $x_1x_0$ calculated in the re-encoder 7 using I-channel data Ich sent thereto from the first shift register $8_1$ and Q-channel data Qch sent thereto from the second shift register $8_2$, and for decoding noncoding bits $x_3x_2$ of 4-bit error-correcting encoded information symbol string $(x_3x_2x_1x_0)$ by inverse mapping the found representative symbol point onto 4-bit data corresponding to it.

The operation of the Viterbi decoder 20 will next be explained with reference to FIG. 3. I-channel data Ich and Q-channel data Qch which are 2m-value soft decision data are inputted to the first inverse mapping circuit 3 by way of two input terminals 1,2, respectively (Step S1). I-channel data Ich is inputted to the first shift register $8_1$ by way of the input terminal 1 and held in the first shift register $8_1$ for a set time. Q-channel data Qch is inputted to the second shift register $8_2$ by way of the input terminal 2 and held in the second shift register $8_2$ for the set time (Step S10). In the first inverse mapping circuit 3, each of the representative symbol points of subsets A, B, C, and D is found from I-channel data Ich and Q-channel data Qch (Step S2). Each of the found representative symbol points of subsets A, B, C, and D is inverse mapped onto 4-bit data corresponding to it (Step S3). In the first branch metric generator $4_1$, a branch metric is calculated based on the Euclidean distance between the reception symbol point indicated by I-channel data Ich and Q-channel data Qch and the representative symbol point of subset A found in the first inverse mapping circuit 3 (Step S4). In the second branch metric generator $4_2$, a branch metric is calculated based on the Euclidean distance between the reception symbol point indicated by I-channel data Ich and Q-channel data Qch and the representative symbol point of subset B found in the first inverse mapping circuit 3 (Step S4). In the third branch metric generator $4_3$, a branch metric is calculated based on the Euclidean distance between the reception symbol point indicated by I-channel data Ich and Q-channel data Qch and the representative symbol point of subset C found in the first inverse mapping circuit 3 (Step S4). In the fourth branch metric generator $4_4$, a branch metric is calculated based on the Euclidean distance between the reception symbol point indicated by I-channel data Ich and Q-channel data Qch and the representative symbol point of subset D found in the first inverse mapping circuit 3 (Step S4). The branch metric calculated in the first branch metric generator $4_1$ is inputted to the first ACS circuit $5_1$, third ACS circuit $5_3$, fifth ACS circuit $5_5$ and seventh ACS circuit $5_7$. The branch metric calculated in the second branch metric generator $4_2$ is inputted to the second ACS circuit $5_2$, fourth ACS circuit $5_4$, sixth ACS circuit $5_6$ and eighth ACS circuit $5_8$. The branch metric calculated in the third branch metric generator $4_3$ is inputted to the second ACS circuit $5_2$, fourth ACS circuit $5_4$, sixth ACS circuit $5_6$ and eighth ACS circuit $5_8$. The branch metric calculated in the fourth branch metric generator $4_4$ is inputted to the first ACS circuit $5_1$, third ACS circuit $5_3$, fifth ACS circuit $5_5$ and seventh ACS circuit $5_7$.

In each ACS circuit $5_1$–$5_8$, in accordance with the two inputted branch metrics and all of the state transitions prescribed in the feedback-type convolutional encoder, each of the two inputted branch metrics is added to the predetermined one of the path metric accumulated values which are held by several states combined in transition with one state of eight states $S_0$–$S_7$ of the feedback-type convolutional encoder, and the greatest addition value is selected as a path metric (maximum likelihood path metric) of the one state (Step S5). The path metrics calculated in the ACS circuit $35_1$–$35_8$ are inputted to the path memory 6, and the contents of the path memory 6 are sequentially updated according to the path metrics to finally obtain the decoded data in the path memory 6 (Step S6). However, the decoded data obtained in the path memory 6 is not encoding bits $x_1x_0$ of the 4-bit error-correcting encoded information symbol string $(x_3x_2x_1x_0)$, but only IB bit $x_1$ within encoding bits $x_1x_0$. IB bit $x_1$ obtained in the path memory 6 is inputted to the re-encoder 7, and in the re-encoder 7, encoding bits $x_1x_0$ are calculated based on the IB bit $x_1$ (Step S7). Here, encoding bits $x_1x_0$ calculated in the re-encoder 7 represent one of subsets A, B, C, and D. Encoding bits $x_1x_0$ calculated in the re-encoder 7 are then inputted to the second inverse mapping circuit 10.

In the second inverse mapping circuit 10, the representative symbol point of the subset indicated by encoding bits $x_1x_0$ calculated in the re-encoder 7 are found using I-channel data Ich sent thereto from the first shift register $8_1$ and Q-channel data Qch sent thereto from the second shift register $8_2$. By inverse mapping the found representative symbol point to 4-bit data corresponding to it, the noncoding bits $x_3x_2$ of the 4-bit error-correcting encoded information symbol string $(x_3x_2x_1x_0)$ are decoded (Step S11). IB bit $x_1$ obtained in the path memory 6 and the noncoding bits $x_3x_2$ decoded in the second inverse mapping circuit 10 are outputted as decoded data (estimated information bits) of information symbol string $(x_3x_2x_1)$ by way of an output terminal 11 and an output terminal 12 (Step S8).

Figure 1:
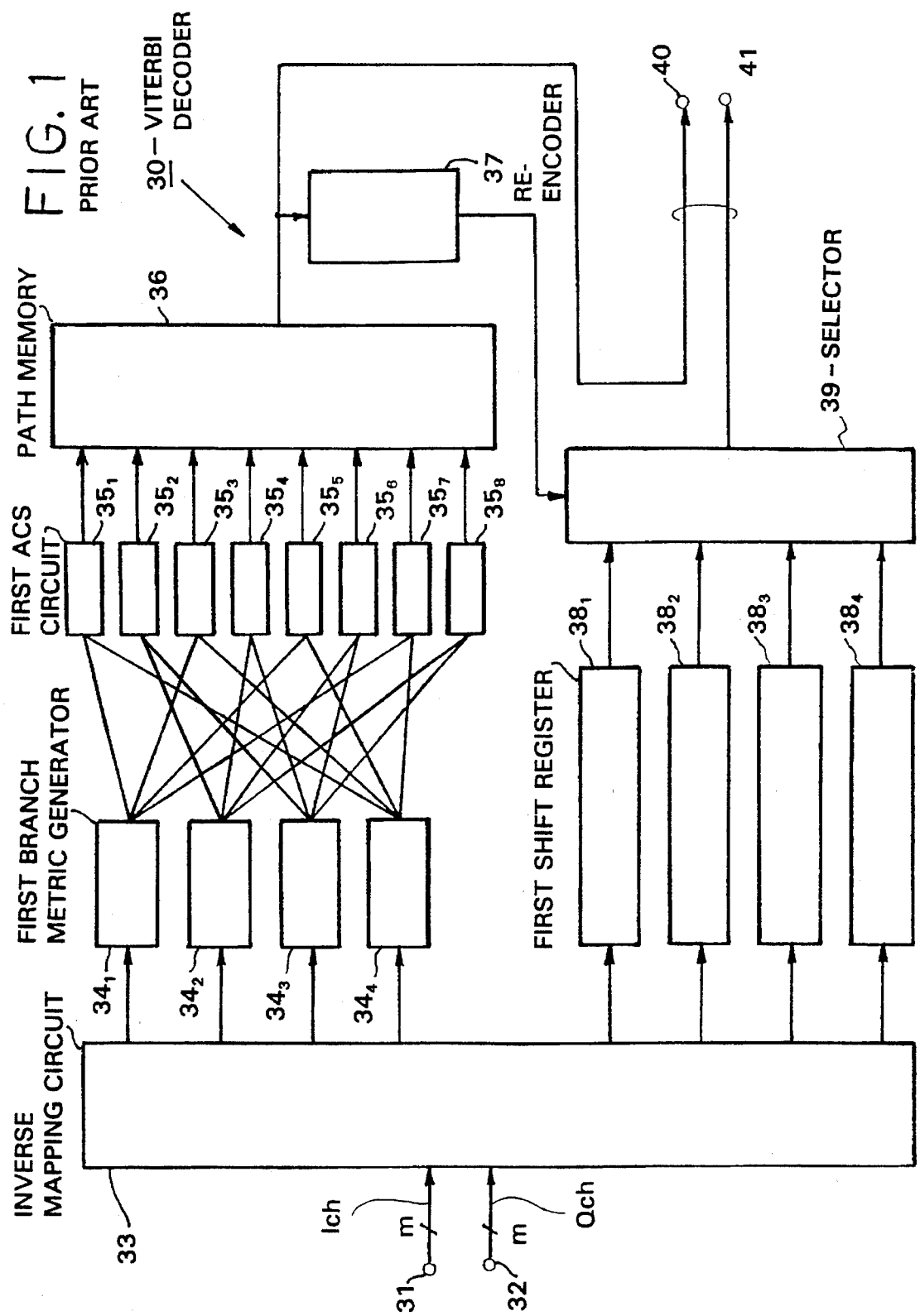
FIG. 1 is a block diagram showing one example of the composition of a conventional Viterbi decoder.

With the Viterbi decoder 20 of the above-described composition, even if the bit number of the information symbol string increases, compensation can be made by increasing the bit numbers of the first and second shift registers $8_1$, $8_2$, and consequently, when the Viterbi decoder 20 is provided in an LSI, the number of gates can be decreased as compared with the Viterbi decoder 30 shown in FIG. 1.

While the present invention has been described in conjunction with preferred embodiments thereof, it will now be possible for one skilled in the art to easily put the present invention into practice in various other manners.

What is claimed is:

1. A Viterbi decoder for decoding an error-correcting encoded information symbol string from first multi-value soft decision data and second multi-value soft decision data each of which is mapped onto one of a plurality of transmission symbol points, the error-correcting encoded information symbol string being generated by error-correcting encoding an information symbol string by means of a feedback-type convolutional encoder, the error-correcting encoded information symbol string comprising noncoding bits which are not under influence of the convolutional encoder, information bits which are under influence of the convolutional encoder and a redundant bit which is generated by the convolutional encoder, the Viterbi decoder comprising:

decoding means for decoding the information bits and the redundant bit of the error-correcting encoded information symbol string from the first multi-value soft decision data and the second multi-value soft decision data;

first data holding means for holding the first multi-value soft decision data for a set period of time;

second data holding means for holding the second multi-value soft decision data for the set period of time; and inverse mapping means for decoding the noncoding bits of the error-correcting information symbol string by finding a representative symbol point of a subset of the transmission symbol points to maximize a Euclidean distance of each of a plurality of subsets of the transmission symbol points, indicated by the decoded information bits and the decoded redundant bit generated by re-encoding information bits among the plurality of subsets using the first multi-value soft decision data received from the first data holding means and the second multi-value soft decision data received from the second data holding means, and by inverse mapping a found representative symbol point onto data corresponding to the found representative symbol point.

2. The Viterbi decoder of claim 1 that further comprises:

first data holding means for holding the first multi-value soft decision data for a time just equal to a time needed for signal processing in the decoding means which is equal to a time form input of the first multi-value soft decision data until the corresponding decoded information bits and the decoded redundant bit are output; and second data holding means for holding the second multi-value soft decision data for a time just equal to the time needed for signal processing in the decoding means.

3. The Viterbi decoder of claim 2 wherein the first data holding means is a shift register for holding the first multi-value soft decision data for a time just equal to the time needed for signal processing in the decoding means.

4. The Viterbi decoder of claim 2 wherein the second data holding means is a shift register for holding the second multi-value soft decision data for a time just equal to the time needed for signal processing in the decoding means.

5. The Viterbi decoder of claim 2 wherein:

the first data holding means is a first shift register for holding the first multi-value soft decision data for a time just equal to the time needed for signal processing in the decoding means; and the second data holding means is a second shift register for holding the second multi-value soft decision data for a time just equal to the time needed for signal processing in the decoding means.

6. A Viterbi decoder for decoding an error-correcting encoded information symbol string from first multi-value soft decision data and second multi-value soft decision data each of which is mapped onto one of a plurality of transmission symbol points, the error-correcting encoded information symbol string being generated by error-correcting encoding an information symbol string by means of a feedback-type convolutional encoder, the error-correcting encoded information symbol string comprising non-coding bits which are not under influence of the convolutional encoder, information bits which are under influence of the convolutional encoder and a redundant bit which is generated by the convolutional encoder, the Viterbi decoder comprising:

first inverse mapping means for finding representative symbol points of a plurality of subsets of the transmission symbol points and for inverse mapping each of a plurality of found representative symbol points onto data corresponding to a respective found representative symbol point, the subsets being formed by dividing the transmission symbol points using the first multi-value soft decision data and the second multi-value soft decision data;

branch metric generating means for calculating branch metrics based on a Euclidean distance between each of the representative symbol points of the subsets found by the first inverse mapping means and a reception symbol point indicated by the first multi-value soft decision data and the second multi-value soft decision data;

accumulator switching means for selecting a greatest addition value as a path metric of one of a plurality of states of the convolutional encoder by adding each of a plurality of path metric accumulated values to a predetermined one of the branch metrics calculated by the branch metric generating means, the path metric accumulated values being held by several states combined in transition with said one state among the plurality of states;

path memory means for sequentially updating its contents according to the path metric selected by the accumulator switching means and for decoding the information bits of the error-correcting encoded information symbol string;

re-encoding means for finding the information bits and the redundant bit of the error-correcting encoded information symbol string from the information bits decoded by the path memory means;

first data holding means for holding the first multi-value soft decision data for a set period of time;

second data holding means for holding the second multi-value soft decision data for the set period of time;

second inverse mapping means for decoding noncoding bits of the error-correcting encoded information symbol string by finding a representative symbol point of a subset indicated by the information bits and the redundant bit found in the re-encoding means using the first multi-value soft decision data sent thereto from the first data holding means and the second multi-value soft decision data sent thereto from the second data holding means and by inverse mapping the found representative symbol point onto data a corresponding to the found representative symbol point.

7. The Viterbi decoder of claim 6 wherein the first data holding means is a shift register for holding the first multi-value soft decision data for a time just equal to the time needed for signal processing in the path memory means and the re-encoding means.

8. The Viterbi decoder of claim 6 wherein the second data holding means is a shift register for holding the second multi-value soft decision data for a time just equal to the time needed for signal processing in the path memory means and the re-encoding means.

9. The Viterbi decoder of claim 6 wherein:

the first data holding means is a first shift register for holding the first multi-value soft decision data for a time just equal to the time needed for signal processing in the path memory means and the re-encoding means, and the second data holding means is a second shift register for holding the second multi-value soft decision data for a time just equal to the time needed for signal processing in the path memory means and the re-encoding means.

10. A digital communications system comprising:

a receiver for receiving a transmitted signal from a transmitter, the receiver having a Viterbi decoder located therein, the Viterbi decoder being adapted for decoding an error-correcting encoded information symbol string from first multi-value soft decision data and second multi-value soft decision data each of which is mapped onto one of a plurality of transmission symbol points, the error-correcting encoded information symbol string being generated by error-correcting encoding an information symbol string by means of a feedback-type convolutional encoder, the error-correcting encoded information symbol string comprising non-coding bits which are not under influence of the convolutional encoder, information bits which are under influence of the convolutional encoder and a redundant bit which is generated by the convolutional encoder, the Viterbi decoder including:

decoding means for decoding the information bits and the redundant bit of the error-correcting encoded information symbol string from the first multi-value soft decision data and the second soft multi-value decision data;

first data holding means for holding the first multi-value soft decision data for a set period of time; and second data holding means for holding the second multi-value soft decision data for the set period of time;

inverse mapping means for decoding the noncoding bits of the error-correcting information symbol string by finding a representative symbol point of a subset of the transmission symbol points to maximize a Euclidean distance of each of a plurality of subsets of transmission symbol points, indicated by the decoded information bits and the decoded redundant bit generated by re-encoding information bits among the plurality of subsets using the first multi-value soft decision data received from the first data holding means and the second multi-value soft decision data received from the second data holding means, and by inverse mapping a found representative symbol point onto data corresponding to the found representative symbol point; wherein the transmitted signal is converted to an error-correcting encoded information symbol string by the convolutional encoder and is decoded by the Viterbi decoder.

11. The digital communication system of claim 10, wherein the Viterbi decoder further comprises first data holding means for holding the first multi-value soft decision data for a time just equal to a time needed for signal processing in the decoding means which is equal to a time from input of the first multi-value soft decision data until the corresponding decoded information bits and the decoded redundant bit are output; and second data holding means for holding the second multi-value soft decision data for a time just equal to the time needed for signal processing in the decoding means.

12. The digital communications system of claim 11, wherein the first data holding means is a shift register for holding the first multi-value soft decision data for a time just equal to the time needed for signal processing in the decoding means.

13. The digital communications system of claim 11, wherein the second data holding means is a shift register for holding the second multi-value soft decision data for a time equal to the time needed for signal processing in the decoding means.

14. The digital communications system of claim 11, wherein the first data holding means is a first shift register for holding the first multi-value soft decision data for a time just equal to the time needed for signal processing in the decoding means; and the second data holding means is a second shift register for holding the second multi-value soft decision data for a time just equal to the time needed for signal processing in the decoding means.

15. A digital communications system comprising:

a receiver for receiving a transmitted signal from a transmitter, the receiver having a Viterbi decoder located therein, the Viterbi decoder being adapted for decoding an error-correcting encoded information symbol string from first multi-value soft decision data and second multi-value soft decision data each of which is mapped onto one of a plurality of transmission symbol points, the error-correcting encoded information symbol string being generated by error-correcting encoding an information symbol string by means of a feedback-type convolutional encoder, the error-correcting encoded information symbol string comprising noncoding bits which are not under influence of the convolutional encoder, information bits which are under influence of the convolutional encoder and a redundant bit which is generated by the convolutional encoder, the Viterbi decoder including:

first inverse mapping means for finding representative symbol points of a plurality of subsets of the transmission symbol points and for inverse mapping each of a plurality of found representative symbol points onto data corresponding to a respective found representative symbol point, the subsets being formed by dividing the transmission symbol points using the firs multi-value soft decision data and the second multi-value soft decision data;

branch metric generating means for calculating branch metrics based on a Euclidean distance between each of the representative symbol points of the subsets found by the first inverse mapping means and a reception symbol point indicated by the first multi-value soft decision data and the second multi-value soft decision data and the second multi-value soft decision data;

accumulator switching means for selecting a greatest addition value as a path metric of one of a plurality of states of the convolutional encoder by adding each of a plurality of path metric accumulated values to a predetermined one of the branch metrics calculated by the branch metric generating means, the path metric accumulated values being held by several states combined in transistion with said one state among the plurality of states;

path memory means for sequentially updating its contents according to the path metric selected by the accumulator switching means and for decoding the information bits of the error-correcting encoded information symbol string;

re-encoding means for finding the information bits and the redundant bit of the error-correcting encoded information symbol string from the information bits decoded by the path memory means;

first data holding means for holding the first multi-value soft decision data for a set period of time;

second data holding means for holding the second multi-value soft decision data for the set period of time; and second inverse mapping means for decoding noncoding bits of the error-correcting encoded information symbol string by finding a representative symbol point of a subset indicated by the information bits and the redundant bit found in the re-encoding means using the first multi-value soft decision data sent thereto from the first data holding means and the second multi-value soft decision data sent thereto from the second data holding means and by inverse mapping the found representative symbol point onto data corresponding to the found representative symbol point; wherein the transmitted signal is converted to an error-correcting encoded information symbol string by the convolutional encoder and is decoded by the Viterbi decoder.

16. The digital communications system of claim 15, wherein the first data holding means is a shift register for holding the first multi-value soft decision data for a time just equal to the time needed for signal processing in the path memory means and the re-encoding means.

17. The digital communications system of claim 15, wherein the second data holding means is a shift register for holding the second multi-soft decision data for a time just equal to the time needed for signal processing in the path memory means and the re-encoding means.

18. The digital communications system of claim 15, wherein the first data holding means is a first shift register for holding the first multi-value soft decision data for a time just equal to the time needed for signal processing in the path memory means and the re-encoding means, and the second data holding means is a second shift register for holding the second multi-value soft decision data for a time just equal to the time needed for signal processing in the path memory means and the re-encoding means.

* * * * *